Figure 1:
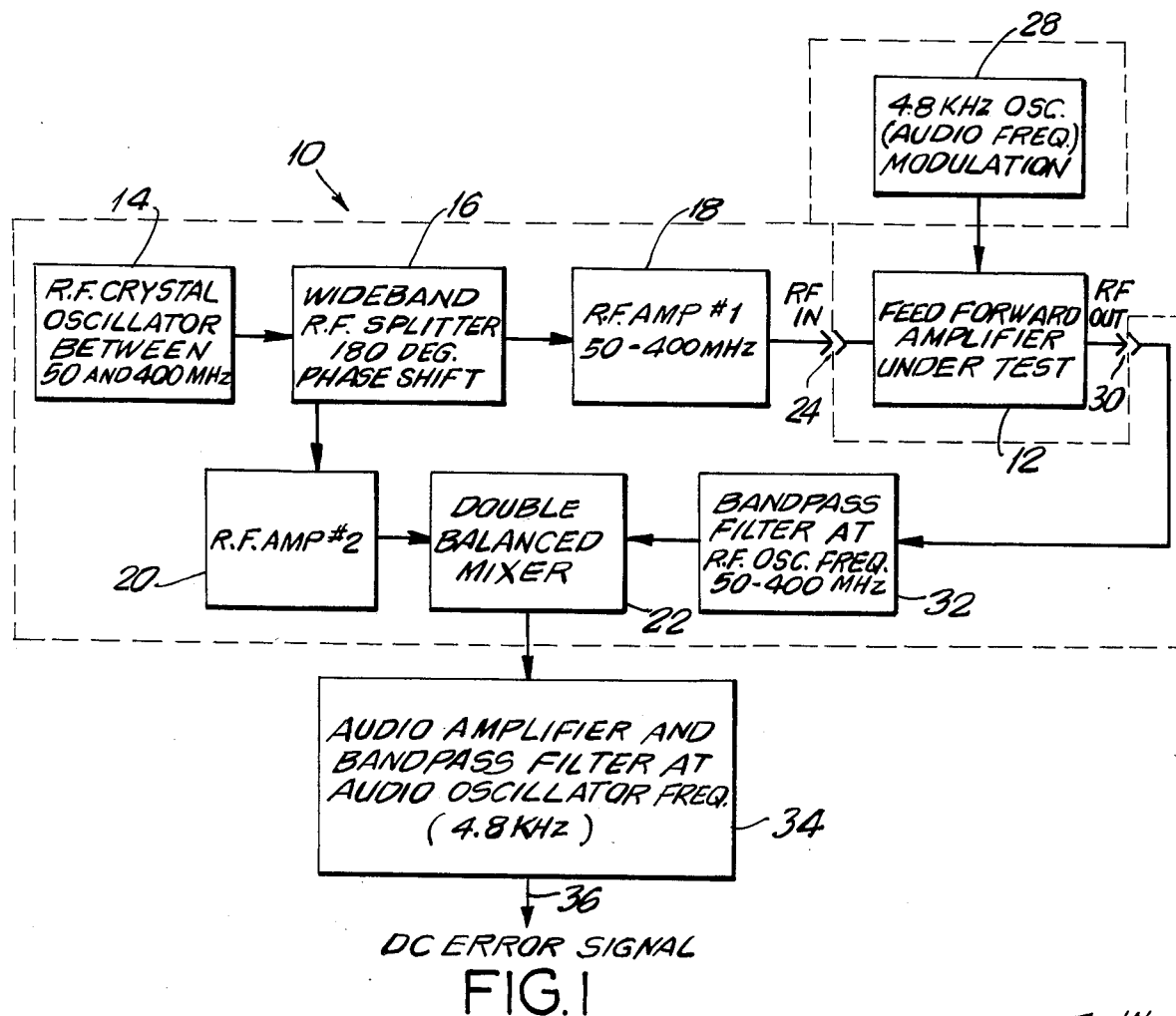

United States Patent [19]

Blumenkranz et al.

[11] Patent Number: 4,792,751
[45] Date of Patent: Dec. 20, 1988

[54] APPARATUS FOR FIELD TESTING THE PERFORMANCE OF A FEEDFORWARD AMPLIFIER

[75] Inventors: Robert M. Blumenkranz, Brea; John O. Roberts, Jr., Santa Ana, both of Calif.

[73] Assignee: General Instrument Corporation, New York, N.Y.

[21] Appl. No.: 812,744

[22] Filed: Dec. 23, 1985

[51] Int. Cl.⁴ .................. G01R 27/00; G01R 19/00; G01R 21/00; G01R 23/00
[52] U.S. Cl. ..................................... 324/57 N; 330/2
[58] Field of Search ............... 324/57 R, 57 H, 57 N, 324/57 Q; 330/2; 455/326; 379/4

[56] References Cited

U.S. PATENT DOCUMENTS

| | | | |
|---|---|---|---|
| 2,988,693 | 6/1961 | Billig et al. | 324/57 N |
| 3,038,119 | 6/1962 | Billig et al. | 324/57 N |

*Primary Examiner*—Reinhard J. Eisenzopf
*Assistant Examiner*—Walter E. Snow
*Attorney, Agent, or Firm*—Hopgood, Calimafde, Kalil, Blaustein & Judlowe

[57] ABSTRACT

An apparatus for field testing a feedforward amplifier includes a source of an RF signal and a source of an audio frequency signal. Both of these signals are applied to the feedforward amplifier under test. A failure in one of the active elements in the feedforward amplifier will increase the level of distortion and thus produce audio-frequency sidebands on the RF carrier at the output of the feedforward amplifier. These audio sidebands are detected in a double balanced mixer which also receives a phase-shifted RF test signal. The output of the double balanced mixer is representative of the level of amplifier distortion and thus of a failure in the feedforward amplifier.

3 Claims, 1 Drawing Sheet

APPARATUS FOR FIELD TESTING THE PERFORMANCE OF A FEEDFORWARD AMPLIFIER

The present invention relates generally to electronic test equipment, and more particularly to an apparatus for field testing a feedforward amplifier.

As described, for example, in U.S. Pat. No. 4,472,725, feedforward amplifiers are often used in cable communication systems to amplify television signals at repeated intervals along a lengthy coaxial cable over which the signals are transmitted. Feedforward amplifiers have been found to be particularly well suited for this application because of their ability to provide relatively distortion-free amplification.

As described in the aforesaid patent, as well as in a publication by one of the inventors herein entitled "A Microprocessor Monitored Feedforward Super Trunk CATV Amplifier", which appeared in the IEEE Transactions on Cable Television, Vol. CATV-5 No. 3, July 1980, a feedforward amplifier utilizes two matched RF amplifier stages. In the operation of a feedforward amplifier, a signal component representative of the distortion introduced by the amplifier is extracted from the amplified signal. That component is then typically phase inverted and the phase-inverted distortion componen is combined with the amplified signals. The phase-inverted component cancels the distortion component in the amplified signal leaving a relatively distortion-free amplified signal for transmission along the cable. To avoid further distortion, the signals must coincide precisely in time when they are recombined. To ensure such coincidence, delay means are provided to delay the signals and thereby compensate for time delays which arise when the signals pass through the various electronic components in the amplifier.

When a failure occurs in one of the active components of a feedforward amplifier, the distortion component is no longer reliably cancelled so that the amplifier output has a relatively and often unacceptably high level of distortion which often may seriously degrade the quality of the television signals received along the cable system. It then becomes necessary to locate the faulty feedforward amplifier to allow the repair crew either to replace or repair the amplifier with minimum interruption to the signal transmission along the cable system of which the feedforward amplifier is a part.

Detection of a failure in a feedforward amplifier is complicated by the fact that even if failure should occur in one of the amplifier stages, the overall gain in the amplifier remains constant since the feedforward amplifier contains redundant amplifier stages. The 20 to 40 db distortion resulting from a failure in an amplifier stage has been used as a basis for failure detection. Thus, in one early method of detecting a failure in a feedforward amplifier, an expensive distortion tsst set had to be taken into the field. The amplifier was removed from the cable transmission system, and its performance was tested. This procedure, however, required a shutdown of the cable transmission system while the amplifier was removed for test. In an attempt to overcome these drawbacks, a procedure was proposed, as described in the aforesaid IEEE Transaction publication, for detecting a failure or degradation of an amplifier stage in a feedforward amplifier, in which the supply voltage applied to an individual amplifier stage was varied or modulated with a square wave, and a receiver was installed at the end of the cable which could detect this modulation. The level of this modulation was, in turn, an indication of the performance level of the feedforward amplifier; that is, as the performance of the amplifier degrades or deteriorates, the detected modulation level increases such that the measured tone level provides a reasonably good indication of the performance of the feedforward amplifier under test.

The test apparatus disclosed in that publication, however, required the use of bulky equipment which was cumbersome to carry in the field where the feedforward amplifiers to be tested were located. The equipment was also relatively insensitive to low levels of distortion, which are frequently encounted in feedforward amplifiers used in cable systems.

It is accordingly an object of the present invention to provide an improved, more sensitive test apparatus for detecting and measuring distortion in a feedforward amplifier.

It is a further object of the present invention to provide a test apparatus of the type described which is lighter in weight and thus more readily portable in the field than prior known apparatus used to test feedforward amplifiers.

It is a more general object of the present invention to provide a lower-cost, lighter-weight, and more effective apparatus for field testing feedforward amplifiers.

The present invention provides an improved test apparatus for evaluating the performance characteristics of feedforward amplifiers with a minimum of interference to the cable transmission system which contains those amplifiers. The apparatus of the invention includes an RF oscillator and an audio-frequency oscillator. Both oscillator signals are applied to the feedforward amplifier under test. Any failure in an active component of the amplifier under test will produce distortion components in the amplifier output, which, in turn, will cause the presence of audio sidebands on the RF carrier at the output of the amplifier.

Those audio sidebands are detected, in a preferred embodiment of the invention, by a double balanced mixer connected to receive both the amplifier output and the RF test signal phase shifted by 180 degrees. The mixer thus combines or mixes the same RF carrier frequencies at a 180 degree phase shift. The output of the mixer, which is essentially equal to the level of the demodulated audio sidebands, is a dc error signal or demodulation which represents the level of distortion introduced by the feedforward amplifier under test. That signal is amplified and detected to produce the relative null depth or cancellation of the feedforward amplifier stage. The mixer output error signal may then be filtered and converted to a digital signal and used to operate a visual or digital display indicating the performance or distortion characteristics of the feedforward amplifier under test.

Figure 2:
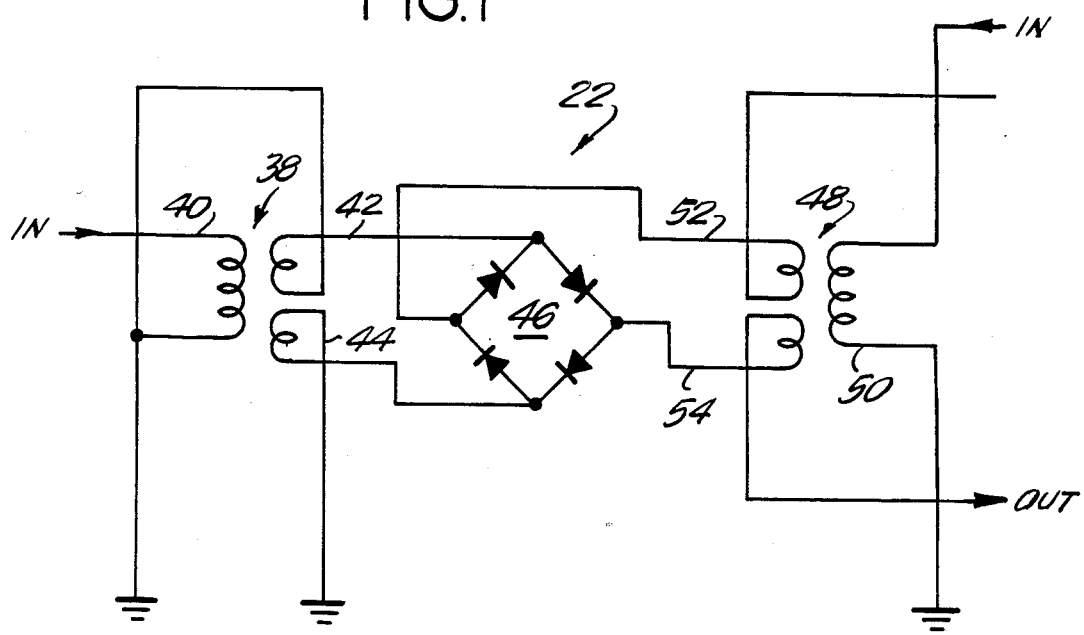

To the accomplishment of the foregoing and such other objects as may hereinafter appear, the present invention relates to a test apparatus for a feedforward amplifier substantially as defined in the appended claims and as described in the following detailed specification as considered with the accompanying drawing in which:

FIG. 1 is a schematic block diagram of a preferred embodiment of a test apparatus for a feedforward amplifier in accordance with the present invention; and FIG. 2 is a schematic diagram of the balanced mixer stage of the test apparatus of FIG. 1.

Referring to the FIG. 1, there is shown a test apparatus generally designated 10 enclosed by the broken-line border for use in evaluating or testing the performance characteristics of a feedforward amplifier 12. The feedforward amplifier may be of any of the per se known configurations used in cable transmission systems, such as that described in the aforesaid patent and publication, and does not constitute a part of the present invention.

The test apparatus of the invention includes an oscillator 14, which advantageously produces an output signal at a frequency in the low RF range of between 50 and 400 mHz. The output of oscillator 14 is applied to a wideband RF signal splitter and 180 degrees phase shifter 16, the outputs of which are respectively applied to the input of a first RF amplifier 18 and to the input of a second RF amplifier 20. The output of amplifier 20 is applied to one input of a mixer, here shown in the form of a double balanced mixer 22.

The output of amplifier 18 is applied to the RF input 24 of the feedforward amplifier under test 12. The amplifier under test also receives an audio frequency modulation signal from an audio oscillator 28. The output of oscillator 28 may be at any suitable audio frequency such as 4-8 KHz as shown.

The RF output of the feedforward amplifier is applied to an RF output terminal 30, which, in turn, is coupled to the input of a bandpass filter 32, which has a bandpass centered at the RF frequency of oscillator 14. The output of filter 32 is applied to the second input of balanced mixer 22.

The output of mixer 22 is applied to an input of an audio amplifier and bandpass filter 34, the output of which at 36, as described below, is a dc error signal which represents the level of distortion introduced to the applied test signals by the feedforward amplifier under test. That error signal may, if desired, be applied to an analog-to-digital converter (not shown) to provide a corresponding digital error signal, which can drive a bar graph or other visual display (also not shown).

As shown in FIG. 2, the double balanced mixer 22 may include a first transformer 38 having a primary winding 40 coupled to the output of amplifier 20 and a pair of grounded secondary windings 42, 44. The latter are connected to the opposed ends of a diode rectifier bridge 46. The mixer 22 also includes a second transformer 48 having a primary winding 50 coupled to the output of filter 32 and two secondary windings 52, 54. One end of each of the seoondary windings 52, 54 is respectively connected to the other opposite ends of the diode bridge; the other ends of the windings 52, 54 are connected to one another and to the mixer output at 36.

Mixer 22, as is per se known, mixes or combines the two input rf frequencies at a 180 degree phase shift with respect to one another, one of which is the filtered output of the feedforward amplifier under test. Balanced mixer 22 produces at output 36 a dc error signal which is proportional to the level of the audio-frequency (4-8 kHz) sidebands on the rf carrier input to the mixer and thus to the feedforward amplifier's intermodulation distortion products. The level of the error signal thus provides an indication of a possible failure or defect in the feedforward amplifier under test as desired.

In operation of the test apparatus of the invention, when it is desired to test a feedforward amplifier for level of distortion, the test apparatus of the invention is connected to the rf input and output of the feedforward amplifier at rf connectors 24 and 30, respectively. The audio frequency signal from oscillator 28 is applied to the feedforward amplifier and a reading or display of the filtered and amplified output of the double balanced mixer 22 is obtained at 36 to provide the desired information concerning the state of the feedforward amplifier under test.

It will be appreciated from the foregoing description of a presently preferred embodiment of the present invention that an improved apparatus for field testing a feedforward amplifier has been described. It will further be understood that although the invention has been described with respect to a presently preferred embodiment of the invention, modifications may be made therein without necessarily departing from the spirit and scope of the present invention.

What is claimed is:

1. An apparatus for testing the performance of a feedforward amplifier, said test apparatus comprising a source of an RF test signal, a source of an audio-frequency test signal, a mixer having first and second inputs and an output, phase shift means coupled to the output of said RF test signal source for producing a phase shifted RF test signal and a non-phase shifted RF test signal, means for respectively applying said non-phase-shifted RF test signal and said audio-frequency test signal to first and second inputs of the feedforward amplifier under test, means for applying the output of the feedforward amplifier under test and said phase-shifted RF test signal to said first and second mixer inputs, respectively, and error signal measuring means operatively connected to the output of said mixer, whereby the level of said error signal represents the level of modulation of the radio frequency signal by said audio-frequency signal and thus the distortion of the feedforward amplifier under test.

2. The test apparatus of claim 1, further comprising a filter having a band pass in the frequency of said RF test signal interposed between the output of the feedforward amplifier under test and said first input of said mixer.

3. The test apparatus of claim 2, further including first and second RF amplifiers respectively connected between the output of said phase shift means and the input to the feedforward amplifier under test, and between the output of said phase shift means and said second input of said mixer.

* * * * *